(12) United States Patent
Cao et al.

(10) Patent No.: US 9,130,019 B2
(45) Date of Patent: Sep. 8, 2015

(54) FORMATION OF CARBON-RICH CONTACT LINER MATERIAL

(71) Applicant: GLOBALFOUNDRIES Inc., Grand Cayman (KY)

(72) Inventors: Huy Cao, Rexford, NY (US); Songkram Srivathanakul, Waterford, NY (US); Huang Liu, Mechanicville, NY (US); Garo Jacques Derderian, Saratoga Springs, NY (US); Boaz Alperson, Rensselaer, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 92 days.

(21) Appl. No.: 14/150,260

(22) Filed: Jan. 8, 2014

(65) Prior Publication Data

US 2015/0194342 A1     Jul. 9, 2015

(51) Int. Cl.
*H01L 21/4763* (2006.01)
*H01L 21/768* (2006.01)
*H01L 23/482* (2006.01)

(52) U.S. Cl.
CPC ...... *H01L 21/76831* (2013.01); *H01L 23/4827* (2013.01)

(58) Field of Classification Search
CPC .............. H01L 21/3162; H01L 21/31612; H01L 21/01115; H01L 21/76831
USPC ............ 438/589, 595, 605, 614, 613, 637; 257/748, 758
See application file for complete search history.

(56) References Cited

U.S. PATENT DOCUMENTS

| | | | |
|---|---|---|---|
| 6,171,945 B1* | 1/2001 | Mandal et al. | 438/622 |
| 6,486,015 B1* | 11/2002 | Chaudhary et al. | 438/229 |
| 2005/0184291 A1* | 8/2005 | Cole et al. | 257/59 |
| 2006/0286766 A1* | 12/2006 | Cole et al. | 438/424 |
| 2011/0008970 A1* | 1/2011 | Alapati et al. | 438/763 |
| 2011/0095258 A1* | 4/2011 | Xu et al. | 257/3 |
| 2011/0256718 A1* | 10/2011 | Haukka et al. | 438/656 |

OTHER PUBLICATIONS

Cao et al., "Low-K Nitride Film and Method of Making", U.S. Appl. No. 13/900,976, filed May 23, 2013, 13 pages.
Cao et al., "Methods for Fabricating Integrated Circuits Utilizing Silicon Nitride Layers," U.S. Appl. No. 13/787,521, filed Mar. 6, 2013, 17 pages.

* cited by examiner

*Primary Examiner* — Shelia V Clark
(74) *Attorney, Agent, or Firm* — Heslin Rothenberg Farley & Mesiti P.C.; Nicholas Mesiti, Esq.

(57) ABSTRACT

Conductive contact structure of a circuit structures and methods of fabrication thereof are provided. The fabrication includes, for instance, providing at least one contact opening disposed over a semiconductor substrate; forming a carbon-rich contact liner material including a carbon-containing species and an elemental carbon disposed therein, the carbon-containing species and the elemental carbon together defining a set carbon content within the carbon-rich contact liner material; and depositing the carbon-rich contact liner material conformally within the at least one contact opening disposed over the semiconductor substrate.

20 Claims, 7 Drawing Sheets

ODC2 – higher C

| Film Type | Selectivity (SiO2/film) |
|---|---|
| ODC2 with PP | 108.7 |
| ODC2 with PP | 112.4 |
| ODC2 with PP | 114.9 |
| NDC2 with PP | 4.8 |
| NDC2 with PP | 4.7 |
| ODC3 PECVD | 38.6 |
| ODC3 PECVD | 39.2 |

| CVD Films | Udsp 45C for 30 seconds | SC1 for 30 sec |
|---|---|---|
| ODC2 with PP | -0.215020408 | -0.386081633 |
| NDC2 with PP | -0.677408163 | -0.704081633 |
| ODC3 PECVD | -0.210142857 | -0.198306122 |

FIG. 2F

| | Center at 193nm | | Edge at 193nm | |
|---|---|---|---|---|
| Film Type | n | k | n | k |
| OCD1 PP with CO2 | 2.0729 | 0.176 | 2.0614 | 0.166 |
| OCD2 PP With CO2 | 1.7507 | 0.072 | 1.7404 | 0.0682 |
| OCD3 PP with CO2 | 1.876 | 0.0568 | 1.8392 | 0.0367 |
| OCD3 PECVD with CO2 | 1.8666 | 0.0481 | 1.849 | 0.0425 |
| NDC1 4MS 180 PP | 2.3215 | 0.3073 | 2.3199 | 0.2999 |
| NDC2 4MS 235 PP | 2.3072 | 0.2679 | 2.3026 | 0.266 |
| NDC3 4MS 310 PP | 2.281 | 0.2469 | 2.2784 | 0.2482 |

FORMATION OF CARBON-RICH CONTACT LINER MATERIAL

BACKGROUND

Semiconductor devices, such as integrated circuit devices, typically include a large number of transistors within a single chip or wafer area. As the integration density of transistors continues to increase, the footprint area occupied by individual transistors continues to decrease. This ever-decreasing transistor size can result in challenges to the performance characteristics of the transistors, including, (for instance), electrical shorting between closely-spaced circuit structures, for example, gate electrodes and/or contact structures, which may contribute to an overall degradation in performance of an integrated circuit device.

Thus, a need exists for preventing electrical shorting of conductive structures, for instance, using suitable contact liner materials to electrically isolate the circuit features, as the integration density of transistor continues to increase.

BRIEF SUMMARY

The shortcomings of the prior art are overcome and additional advantages are provided through the provision, in one aspect, of a method of fabricating a conductive contact structure of a circuit structure. The fabricating includes, for instance: providing at least one contact opening disposed over a semiconductor substrate; forming a carbon-rich contact liner material comprising a carbon-containing species and an elemental carbon disposed therein, the carbon-containing species and the elemental carbon together defining a set carbon content within the carbon-rich contact liner material; and depositing the carbon-rich contact liner material conformally within the at least one contact opening disposed over the semiconductor substrate.

In a further aspect, a device is provided which includes a conductive contact structure of a circuit structure, the conductive contact structure including: at least one contact opening disposed over a semiconductor substrate; and a carbon-rich contact liner material deposited conformally within the at least one contact opening, the carbon-rich contact liner material including a carbon-containing species and an elemental carbon disposed therein, wherein the carbon-containing species and the elemental carbon together define a set carbon content within the carbon-rich contact liner material.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that in making reference below to the drawings (which are not drawn to scale for ease of understanding) the same reference numbers used throughout different figures designate the same or similar components.

In one aspect, semiconductor device fabrication, typically involves a process of depositing a conductive metal into an appropriately configured opening in an intermediate circuit structure, for instance, to facilitate forming a contact structure and/or a gate electrode. This process being often referred to as contact metallization and gate metallization, respectively. As the integration density of transistor continues to increase, the footprint area available for a gate electrode, as well as for contact structures to the active regions of the circuit structures, continues to decrease. This decrease in available footprint area for contact structures and gate electrodes may result in electrical shorting, which may contribute to an overall degradation in performance of semiconductor device, as the semiconductor device fabrication processing transitions to gate pitch 20 nanometers processing and below.

To address this issue, disclosed herein is a novel method for forming a contact liner material for use, for instance, in fabricating a conductive contact structure, which is particularly suited for 20 nm gate pitch semiconductor fabrication technology. For instance, the contact liner material described herein is deposited within a contact opening, to prevent electrical shorting between the contact structure and the gate electrode, for instance, in a gate-last fabrication processing (also referred to herein as replacement metal gate or replacement gate fabrication technique). Advantageously, the contact liner material may be deposited, for instance, after a silicidation process within the contact structure, prior to the deposition of conductive contact material, and thereby improve the overall performance of the circuit device.

Generally stated, provided herein, in one aspect, is a method for fabricating a conductive contact structure of a circuit structure. The fabricating includes, for instance: providing at least one contact opening disposed over a semiconductor substrate; forming a carbon-rich contact liner material including a carbon-containing species and an elemental carbon disposed, the carbon-containing species and the elemental carbon together defining a set carbon content within the carbon-rich contact liner material; and depositing the carbon-rich contact liner material conformally within the at least one contact opening disposed over the semiconductor substrate.

By way of example, the carbon-containing species includes an oxide material, the oxide material being at least one of a silicon-oxycarbide (SiOC) material or a silicon oxycarbonitride (SiOCN) material. In one aspect of the present invention, an interaction between a carbon source and an organosilane precursor in a plasma chamber facilitates forming the silicon oxycarbide (SiOC) and the elemental carbon, and depositing the silicon oxycarbide (SiOC) and the elemental carbon subsequently within at least one contact opening. By way of specific example, the carbon source may include, for example, a carbon dioxide ($CO_2$) gas, while the organosilane precursor may include at least one of tetramethylsilane (4MS), trimethylsilane (3MS), dimethylsilane (2MS) or monomethylsilane (MS).

In another aspect of the present invention, an interaction between a carbon source, an organosilane precursor and a nitrogen source in a plasma chamber facilitates forming the silicon oxycarbonitride (SiOCN) and the elemental carbon (C), and depositing the silicon oxycarbonitride (SiOCN) and the elemental carbon subsequently within at least one contact opening. Organosilane precursor may include at least one of, for example, tetramethylsilane (4MS), trimethylsilane (3MS), dimethylsilane (2MS) or monomethylsilane (MS), while the carbon source may be, for example, carbon dioxide ($CO_2$) gas. Nitrogen source may include, in one example, nitrous oxide ($N_2O$) gas or ammonia ($NH_3$) gas.

In one embodiment, the dielectric constant of the carbon-rich contact liner material is less than that of silicon nitride, for example, being in the range of about 2 to 6. Note that the set carbon content disposed within the carbon-rich contact liner material has a range of about 5% to 50%, where the set carbon content facilitates in tailoring the etch-property of the carbon-rich contact liner material disposed within the at least one contact opening. In one example, tailoring the etch-property of the carbon-rich contact liner material may include making the carbon-rich contact liner material to be preferentially susceptible to, for instance, anisotropic etching processes, such as, for example, reactive ion etching (RIE), SiConi etching process or argon sputtering, while inhibiting an isotropic wet etching process, typically performed using wet chemical etchants. Additionally, in one example, refractive index of the carbon-rich contact liner material has a range of about 1.4 to 2.0 while the extinction coefficient may be in the range of about 0 to 0.45. Note that the carbon-rich contact liner material disclosed herein is designed to function as an etch stop layer.

By way of explanation, certain embodiments of fabricating a conductive contact structure of a circuit structure, which includes a carbon-rich contact liner material disposed within a contact opening, in accordance with one or more aspects of the present invention, are described below with reference to FIG. 1.

Figure 1:
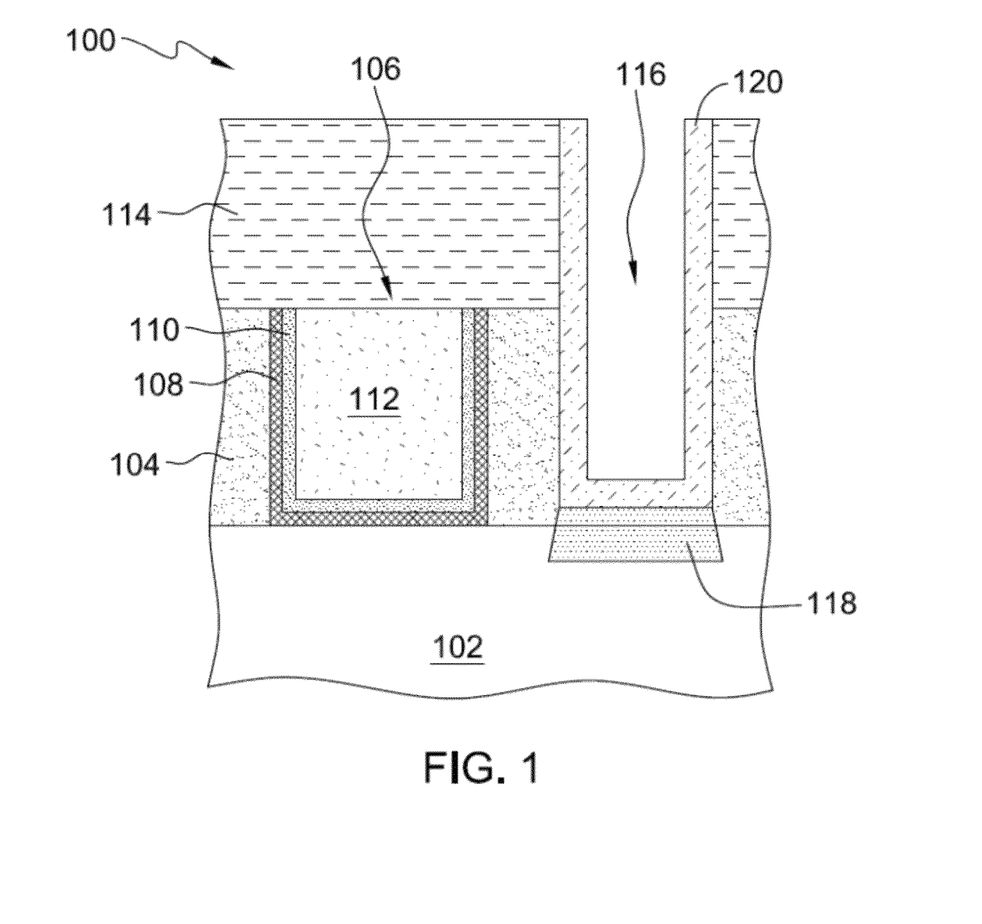
FIG. 1 is a cross-sectional elevational view of one embodiment of a structure obtained during fabrication of a circuit structure, which includes a carbon-rich contact liner material within a contact opening, in accordance with one or more aspects of the present invention.

FIG. 1 is a cross-sectional elevational view of one embodiment of a structure 100 obtained during fabrication of a circuit structure, in accordance with one or more aspects of the present invention. In the example shown, structure 100 includes a semiconductor substrate 102, such as bulk semiconductor material, for example, a bulk silicon wafer. In one example, semiconductor substrate 102 may include any silicon-containing substrate including, but not limited to silion (Si), single crystal silicon, polycrystalline Si, amorphous Si, silicon-on-nothing (SON), silicon-on-insulator (SOI), or silicon-on-replacement insulator (SRI) substrates and the like. Semiconductor substrate 102 may in addition or instead include various isolations, dopings and/or device features. The semiconductor substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof. Semiconductor substrate 102 may also include isolation regions, various doped regions, other suitable features, and/or combinations thereof. The semiconductor substrate 102 may be a planar substrate, or three-dimensional, such as FINS or Nanowires.

A dielectric layer 104 is shown disposed over semiconductor substrate 102. As one example, dielectric layer 104 may be a field oxide such as, flowable oxide, of relatively low quality within the spectrum of available oxides. In another example, dielectric layer 104 may include, but not limited to, silicon nitride (SiN), silicon nitride ($Si_3N_4$), silicon oxide (SiO2), fluorinated silicate glass (FSG).

Dielectric layer 104 may be provided with a gate structure 106, for instance, using conventional fabrication processing such as, gate-last fabrication processing technique. Although not critical to the invention, gate structure 106 may include one or more conformally deposited layers such as a gate dielectric layer 108, one or more work function layer(s) 110 disposed over gate dielectric layer 108 and a gate material 112 disposed over one or more work function layer(s) 110. The various layers depicted in the figures may be formed from a variety of different materials using a variety of techniques, such as, for example, atomic layer deposition (ALD) and chemical vapor deposition (CVD). The thickness of the gate layers may also vary, depending upon the particular application.

By way of example, gate dielectric layer 108 may be formed of a material such as silicon dioxide or a high-k dielectric material with a dielectric constant k greater than about 3.9 (e.g., k=3.9 for $SiO_2$) and may be deposited by performing a suitable deposition process, such as atomic layer deposition (ALD), chemical vapor deposition (CVD), physical vapor deposition (PVD), or the like. Examples of high-k dielectric materials that may be used in the gate dielectric layer 108 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

One or more work-function layers 110 may be conformally deposited over the gate dielectric layer 108, for example, via a deposition process such as ALD, CVD or PVD. The work-function layer(s) 110 may include, for instance, one or more P-type metals or one or more N-type metals, depending on whether the gate structure is to include, for instance, a PFET or an NFET. The work-function layer(s) 110 may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. Although, the gate material 112 may include a metal, such as, for example, aluminum (Al), nickel (Ni), cobalt (Co), and titanium (Ti) and may be conformally deposited over the work function layer(s) 110 using processes, such as for instance, atomic layer deposition (ALD) or chemical vapor deposition (CVD), the gate material, used for the purposes of the present invention, may be tungsten. The gate material 112, in another example, may include polysilicon or polycrystalline silicon.

Structure 100 may further include a protective hard mask 114, disposed over gate structure 106, to protect the underlying gate structure during subsequent fabrication processing. Protective hard mask 114 may be deposited using conventional deposition processes, such as, for example, chemical vapor deposition (CVD), atomic layer deposition (ALD), low-pressure CVD, or plasma-enhanced CVD (PE-CVD). In one example, protective hard mask 114 may have conventional thickness and may include or be fabricated of a material such as, for example, silicon nitride.

One or more etching processes are performed through protective hard mask 114 and dielectric layer 104 to define a contact opening 116 in the circuit structure. Any conventional etching process such as anisotropic etching process or an isotropic etching process may be employed to perform the etching process. Note that, the size and configuration of contact opening 116 may vary, depending upon the particular application. In one illustrative embodiment, contact opening 116 is formed by performing dry anisotropic etching process, for example, reactive ion etching, to define the contact opening, with appropriate changes in the etch chemistry of such etching processes as may be required to etch through protective hard mask 114 and dielectric layer 104.

Although not depicted in figures, one skilled in the art will know that, a source and a drain region (also referred to as active region) may be provided over substrate 102. Active region may be formed using any suitable techniques, including, for example, ion implantation, epitaxial growth of the embedded source/drain materials and activation anneals. A silicide 118 may be formed within (for instance, the active region) contact opening 116. The silicide 118 may be formed from a refractory metal, such as, for example, cobalt, nickel, titanium, tantalum, platinum, palladium, rhodium and mixtures thereof that have been chemically reacted with the silicon of substrate 102 exposed within contact opening 116.

A contact liner material 120 is deposited within contact opening 116, in accordance with one or more aspects of the present invention. In one example, contact liner material 120 may be fabricated of or include a material that is rich in carbon content, and more particularly, carbon-rich contact liner material 120 includes, for instance, a carbon-containing species and an elemental carbon disposed within the carbon-rich contact liner material. Further, the carbon-containing species disposed within the carbon-rich contact liner material may include or be fabricated of an oxide material such as, for example, silicon oxycarbide (SiOC) or silicon oxycarbonitride (SiOCN). Note that, the carbon-containing species such as silicon oxycarbide (SiOC) and silicon oxycarbonitride (SiOCN) may also be referred to herein as "carbon-doped oxide" (CDO) or "Oxide doped Carbon" (ODC) materials. Note further that the carbon present within the carbon-containing species and the elemental carbon together define a set carbon-content disposed within the carbon-rich contact liner material.

In one embodiment, carbon-rich contact liner material 120 is formed in a plasma chamber, by injecting process gases such as, for example, a carbon source, an organosilane precursor and/or a nitrogen source in presence of inert gases, such as, helium (He), argon (Ar) and/or nitrogen, at a pressure of about 1 Torr to 9 Torr and a temperature of about 250° C. to about 475° C. In one specific example, an interaction between a carbon source, for instance, carbon dioxide ($CO_2$) gas and an organosilane precursor such as, for example, tetramethylsilane (4MS), trimethylsilane (3MS), dimethylsilane (2MS) or monomethylsilane (MS) in presence of inert gases, for instance, helium (He), argon (Ar) or nitrogen ($N_2$), facilitates in forming silicon oxycarbide (SiOC), as well as elemental carbon (C) along with other volatile residual products, the silicon oxycarbide (SiOC) and the elemental carbon being subsequently disposed within contact opening 116 as a carbon-rich contact liner material 120.

In this example, the reaction in plasma chamber may be summarized as follows:

$$CO_2 + xMS + SSED \rightarrow SiOC + C + O_2 + CH^- + CO^-$$

where x=4, 3, 2 or 1.

By way of further example, when process gases containing a carbon-source, such as, for instance, carbon dioxide and organosilane precursor, for example, tetramethylsilane, are injected into the plasma chamber, the plasma causes the carbon dioxide gas to dissociate into a carbon radical and corresponding oxygen radicals, while the tetramethylsilane may dissociate into corresponding silyl radicals and methyl radicals. The carbon radical and the corresponding oxygen radicals further interact with silyl radicals resulting in formation of silicon oxycarbide (SiOC) and elemental carbon, having a set carbon content disposed within the carbon-rich contact liner material. Note that, the set carbon content disposed within the silicon oxycarbide (SiOC) and the elemental carbon may be changed by varying the process parameters, such as, for example, varying the gas flow rates of the process gases, for instance, carbon source and organosilane precursor. In one example, the set carbon content disposed within the carbon-rich contact liner material, having silicon oxycarbide (SiOCN) and elemental carbon, may have range of about 5% to 50%.

The structure discussed above is placed in the plasma chamber, upon which an amorphous-form of silicon oxycarbide (SiOC) and the elemental carbon are deposited conformally within contact opening 116. The silicon oxycarbide (SiOC) and elemental carbon disposed within contact opening 116 may have a uniform thickness and, in one example, may be in the range of about 50 angstroms to about 60 angstroms.

In another specific example, interaction between a carbon source, for instance, carbon dioxide ($CO_2$) gas, an organosilane precursor such as, for example, tetramethylsilane (4MS), trimethylsilane (3MS), dimethylsilane (2MS) or monomethylsilane (MS) and a nitrogen source, for example, nitrous oxide ($N_2O$), ammonia gas ($NH_3$) in presence of inert gases, for instance, helium (He), argon (Ar) or nitrogen ($N_2$), at a pressure of about 1 Torr to about 9 Torr and a temperature of about 250° C. to about 475° C., facilitates in forming silicon oxycarbonitride (SiOCN), as well as elemental carbon (C) along with other volatile residual products, the silicon oxycarbonitride (SiOCN) and the elemental carbon being subsequently disposed within contact opening 116 as a carbon-rich contact liner material 120.

In this example, the reaction in plasma chamber may be summarized as follows:

$$CO_2 + xMS + N_2O/NH_3 + SSED \rightarrow SiOCN + C + N + O_2 + CH^- + CO^-$$

where x=4, 3, 2 or 1.

By way of further example, when process gases containing a carbon-source, such as, for instance, carbon dioxide, organosilane precursor, for example, tetramethylsilane, and a nitrogen source, for example, nitrous oxide ($N_2O$) are injected into the plasma chamber, the plasma causes the carbon dioxide gas to dissociate into a carbon radicals and corresponding oxygen radicals, while the tetramethylsilane may dissociate into corresponding silyl radicals and methyl radicals and nitrous oxide dissociates into nitrogen radicals and oxygen radicals. The carbon radicals and the corresponding oxygen radicals further interact with silyl radicals and nitrogen radicals resulting in formation of silicon oxycarbonitride (SiOCN) and elemental carbon, having a set carbon content disposed within the carbon-rich contact liner material. Note that, the set carbon content disposed within the silicon oxycarbonitride (SiOCN) and the elemental carbon may be changed by varying the process parameters, such as, for example, varying the gas flow rates of the process gases, for instance, carbon source, organosilane precursor and nitrogen source. In one example, the set carbon content disposed within carbon-rich contact liner material 120, having silicon oxycarbonitride (SiOCN) and elemental carbon, may have range of about 5% to 50%.

As discussed above, the structure is placed in the plasma chamber, upon which an amorphous-form of silicon oxycarbonitride (SiOCN) and the elemental carbon are deposited conformally within contact opening 116. The silicon oxycarbonitride (SiOCN) and elemental carbon disposed within contact opening 116 may have a uniform thickness and, in one example, may be in the range of about 50 angstroms to about 60 angstroms.

In a further embodiment, note that carbon-rich contact liner material 120, for instance, silicon oxycarbide (SiOC) and elemental carbon or silicon oxycarbonitride (SiOCN) and elemental carbon, has a dielectric constant less than the dielectric constant of silicon nitride (e.g., k=7.0 for silicon nitride (SiN)). In one example, carbon-rich contact liner material 120 may act as a medium-k dielectric material or a low-k dielectric material, having a dielectric constant in the range of about 2.0 to about 6.0, depending on the set carbon content disposed within carbon-rich contact liner material. Additionally, the refractive index of carbon-rich contact liner material 120 has a range of about 1.4 to 2.0, while the extinction coefficient may be in the range of about 0 to about 0.45, which may also depend on the set carbon-content disposed within the carbon-rich contact liner material.

Further, in another aspect of the present invention, the set carbon-content disposed within carbon-rich contact liner material 120 facilitates in tailoring the etch-property of carbon-rich contact liner material 120 disposed within contact opening 116. Although carbon-rich contact liner material 120 may be easily removed by, for instance, anisotropic etching process such as, SiConi etching process, reactive ion etching, argon sputter, the set carbon content disposed within the carbon-rich contact liner material modulates the etch-rates at which the carbon-rich contact liner material may be removed, and thereby controlling the etching of carbon-rich contact liner material 120. For instance, the increase in the content of carbon present in carbon-rich contact liner material 120 proportionally decreases the etch-rate of the contact liner material, to a given etching process. In one example, the carbon-rich contact liner material, having a higher percentage of carbon, may be etched relatively slower than the carbon-rich contact liner material, having a lower percentage of carbon, using argon sputter and reactive ion etching as compared to SiConi etching process. Note also that, the set carbon content disposed within the carbon-rich contact liner material 120 inhibits isotropic etching process, for instance, performed using wet chemical etchants, and thereby providing a conformal contact liner material that is resistant to degradation, during subsequent fabrication processing. This tailoring of etch-property of the carbon-rich contact liner material, advantageously, facilitates in carbon-rich contact liner material 120 functioning as an etch-stop layer, the carbon-rich contact liner material further facilitating in controlling the depth of the etching, during subsequent etching processes. Note that, the carbon-rich contact liner material has been deposited after the silicide has been created within contact opening 116 (see FIG. 1) and residual unreacted silicide precursors have been removed.

By way of further clarification, FIGS. 2A-2G illustrate representative examples of experimental data provided in support of the above discussion, in accordance with one or more aspects of the present invention.

Figure 2A:
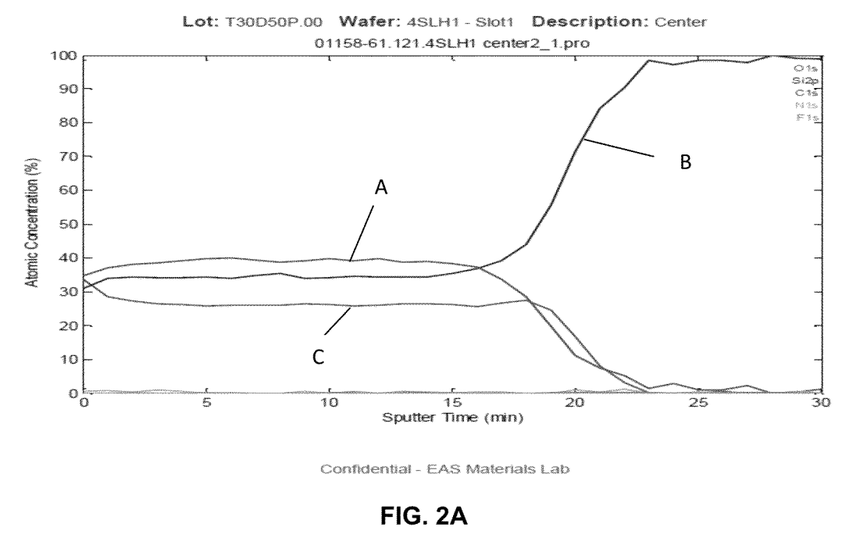
FIGS. 2A-2G depict representative examples of experimental data for the carbon-rich contact liner material, in accordance with one or more aspects of the present invention.
Figure 2B:
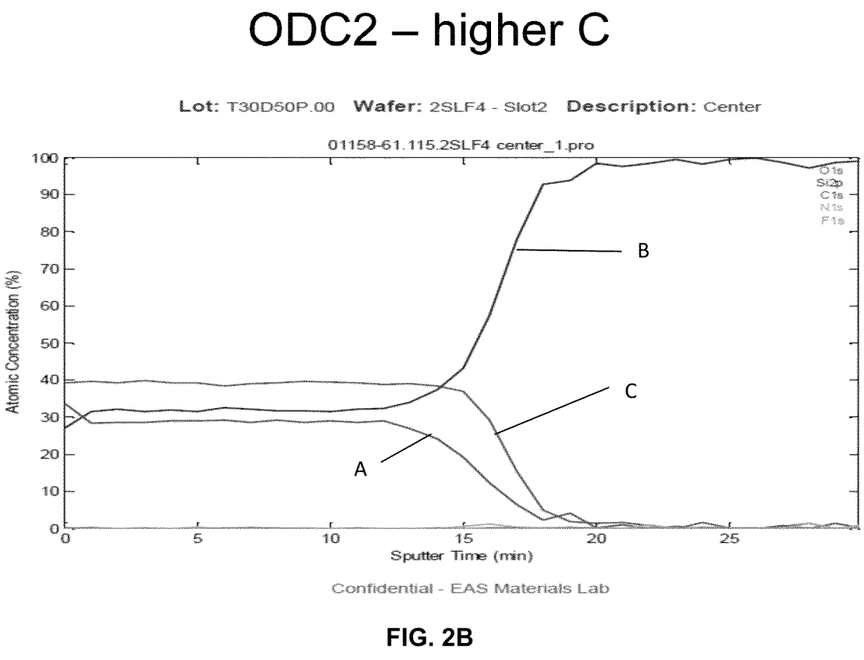
Figure 2C:
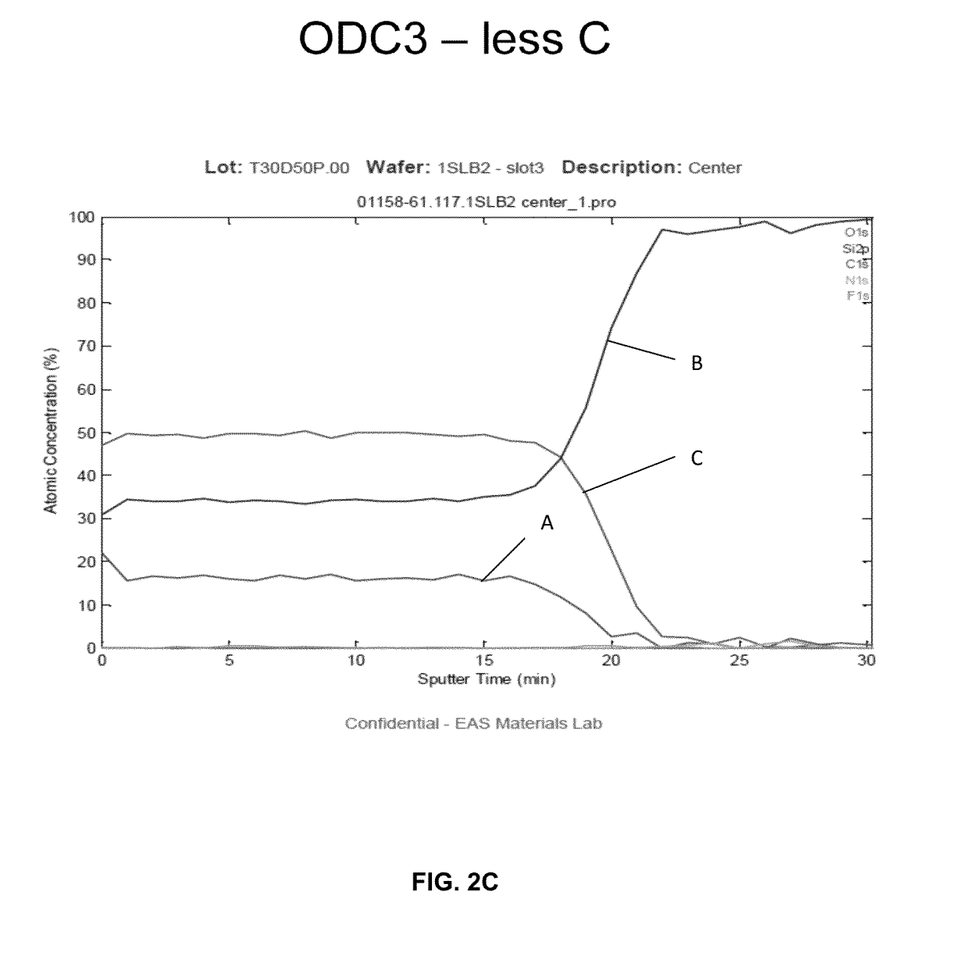
Figure 2D:
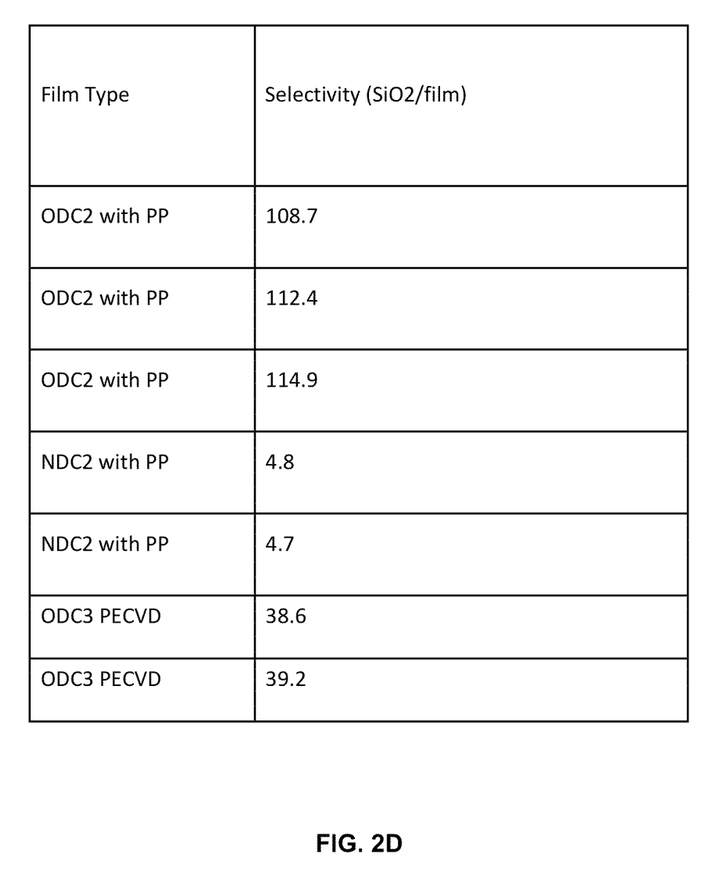

FIGS. 2A-2C depict comparative examples of set carbon content disposed within three representative samples of carbon-rich contact liner materials. In this example, carbon-rich contact liner material containing, silicon oxycarbide (SiOC) and the elemental carbon, are referred to herein as ODC1, ODC2 and ODC3. Note that, the elemental composition of these three samples have been analyzed using X-ray photoelectron spectroscopy (XPS).

The elemental composition of carbon-rich contact liner material "ODC1", (for example, silicon oxycarbide (SiOC) and the elemental carbon), as depicted in FIG. 2A, includes:
 (A) carbon (at. wt %): 40%;
 (B) Silicon (at. wt %): 32%
 (C) oxygen (at. wt %): 28%

As depicted in FIG. 2B, the elemental composition of carbon-rich contact liner material "ODC2", (for example, silicon oxycarbide (SiOC) and the elemental carbon) includes:
 (A) carbon (at. wt %): 29%;
 (B) Silicon (at. wt %): 32%
 (C) oxygen (at. wt %): 39%

As depicted in FIG. 2C, the elemental composition of carbon-rich contact liner material "ODC3", (for example, silicon oxycarbide (SiOC) and the elemental carbon) includes:
 (A) carbon (at. wt %): 16%;
 (B) Silicon (at. wt %): 32%
 (C) oxygen (at. wt %): 28%

As discussed above, FIG. 2D depicts comparative examples of selectivity of various carbon-rich contact liner materials with respect to SiConi etching process. The representative carbon-rich contact liner materials include, in one example, silicon oxycarbide (SiOC) and the elemental carbon, with varying percentages of carbon content, are referred to herein as ODC1 (see FIG. 2A), ODC2 (see FIG. 2B), ODC3 (see FIG. 2C), while the representative example for silicon oxycarbonitride (SiOCN) and the elemental carbon is referred to herein as NDC2. One skilled in the art will note that, in this comparative example, the etch-rates of contact liner materials containing a combination of silicon oxycarbide (SiOC) and the elemental carbon, and a combination of silicon oxycarbonitride (SiOCN) and the elemental carbon are compared with the etch-rates of a conventional thermal silicon oxide, under similar process parameters. In one specific example, the sample ODC2 having carbon content of about 29 at.wt %, may have a 100% post plasma (PP) etch-selectivity as compared to a conventional thermal silicon oxide ($SiO_2$), during a SiConi etching process.

Figure 2E:
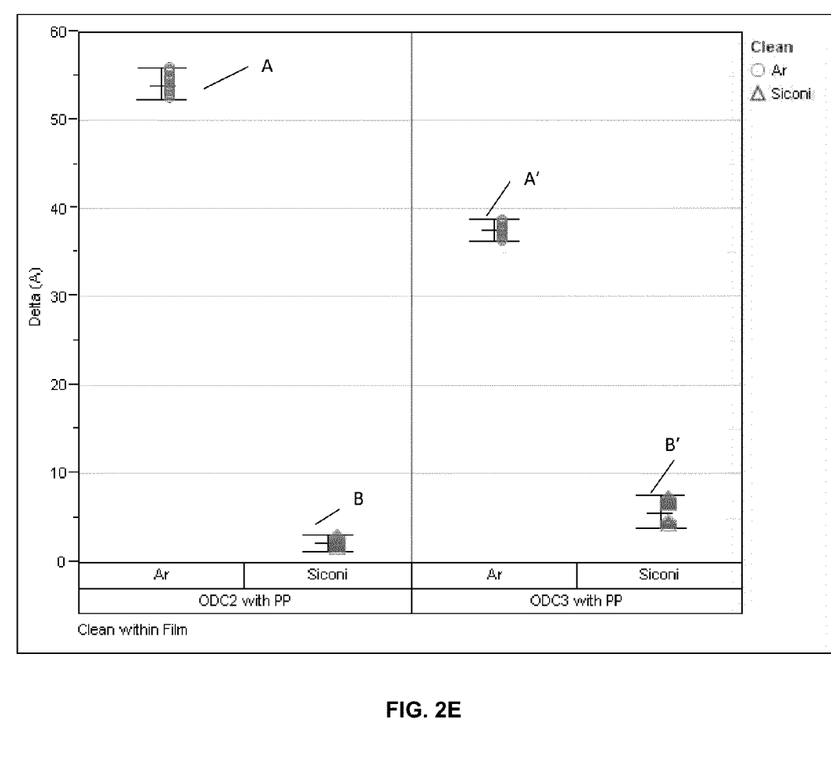

By way of further explanation, FIG. 2E depicts comparative examples of etch-rates of various carbon-rich contact liner materials with respect to SiConi etching process and argon sputter etching process. In a specific example, the sample ODC2, having a carbon content of about 29 at. wt % etches substantially faster, during an argon sputter etching process (A) as compared to SiConi etching process (B). In a further example, although the sample ODC3 having a carbon content of about 16 at. wt % has a faster etch-rate, during an argon sputter etching process (A') as compared to SiConi etching process (B'), the over-all etch-rate of ODC3 is relatively slower than the over-all etch-rate of ODC2, during a given argon sputter etching process. Note that this supports the above discussion, that the set carbon-content disposed within carbon-rich contact liner material 120 (see FIG. 1) facilitates in selectively tailoring the etch-property of carbon-rich contact liner material 120 (see FIG. 1) disposed within contact opening 116 (see FIG. 1). As discussed above, this selective tailoring of etch-property of the carbon-rich contact liner material, advantageously, facilitates in the carbon-rich contact liner material functioning as an etch-stop layer, the carbon-rich contact liner material further facilitating in controlling the depth of the etching, during subsequent etching processes.

Figure 2F:
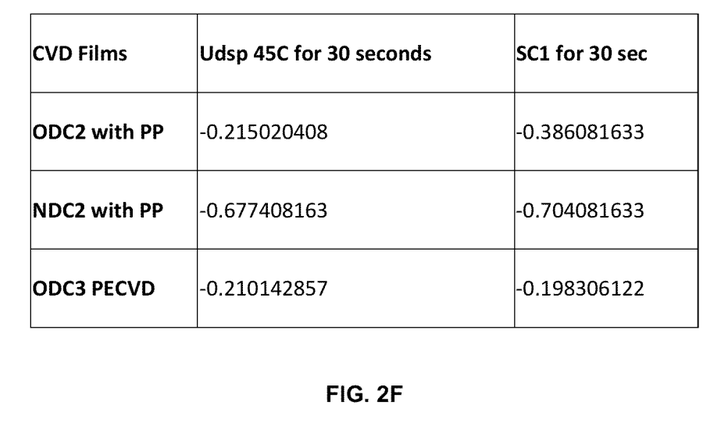
Figure 2G:
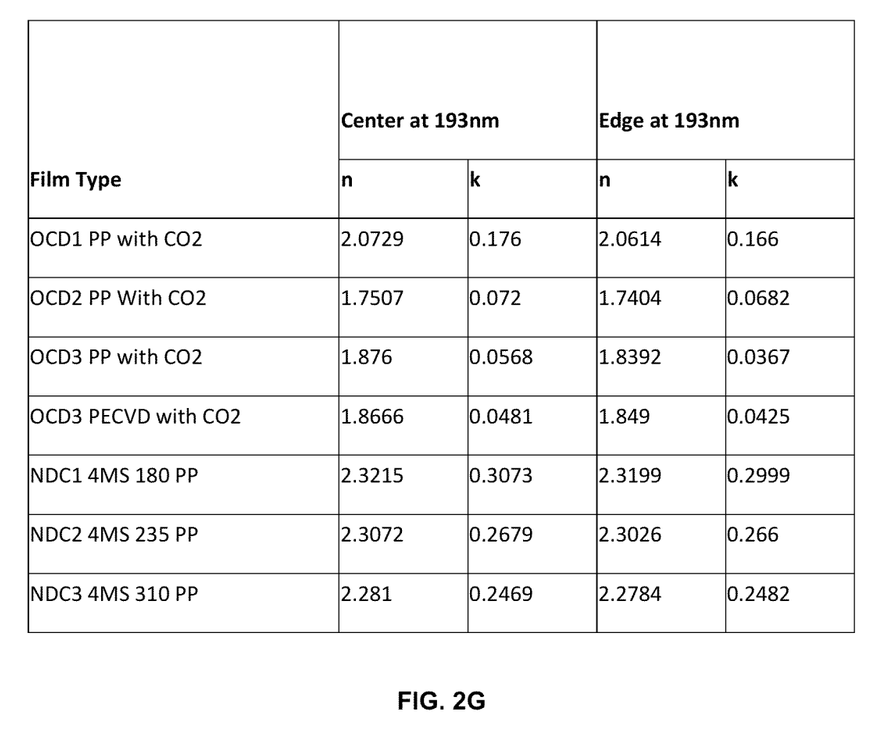

FIG. 2F depicts comparative examples of etch-resistance of the carbon-rich contact liner material, in accordance with one or more aspects of the present invention. In this example, the set carbon content disposed within the carbon-rich contact liner material inhibits isotropic etching process, for instance, using wet chemical etchants such as, for example, Udsp and SC1. Further, refractive indices and the corresponding extinction coefficiencies of various carbon-rich contact liner materials having different percentages of carbon content disposed therein are tabulated and depicted in FIG. 2G.

Figure 3:
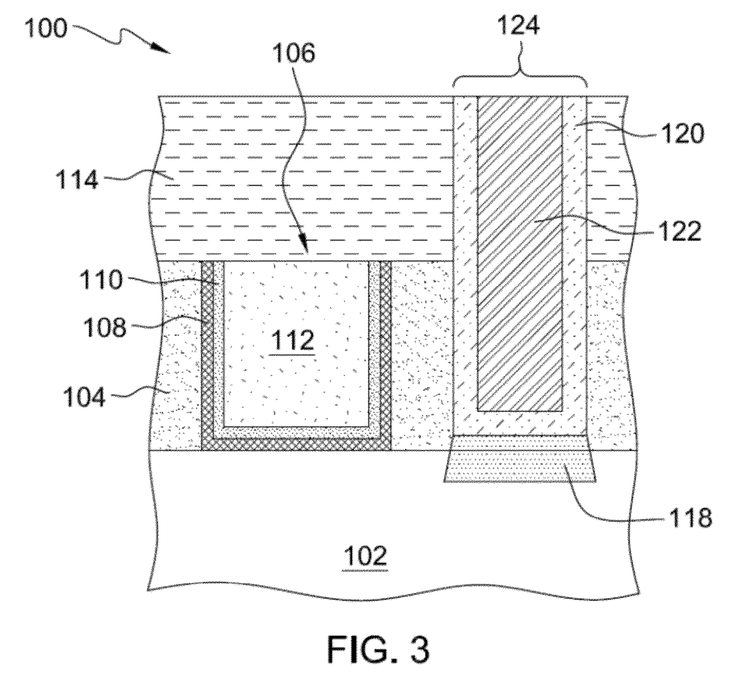
FIG. 3 depicts a resultant structure of FIG. 1, with a conductive contact material disposed over the carbon-rich contact liner material, in accordance with one or more aspects of the present invention.

Subsequent fabrication processing may proceed, where a conductive contact material 122 may be provided over carbon-rich contact liner material 120 (within the contact opening 116 (see FIG. 1)), resulting in a conductive contact structure 124, as depicted in FIG. 3. In one example, conductive contact material 122 may be any of a variety of conductive materials, such as tungsten, copper, aluminum, etc.

In one example of the process, a tungsten nucleation layer (not shown) may be deposited over carbon-rich contact liner material 120 to facilitate the subsequent formation of the bulk tungsten material, using conventional deposition processes such as chemical vapor deposition (CVD), atomic layer deposition (ALD) or pulsed nucleation layer deposition (PNL) deposition processes. The thickness of the nucleation layer may be about 1 nm to about 4 nm and may be deposited by, for instance, performing alternating pulsing sequences of boron-containing reducing agent and tungsten-containing precursor in presence of a reducing agent. The boron-containing reducing agents include, but are not limited to borane ($BH_3$), diborane ($B_2H_6$), triborane, boron halides such as, for example, boron trifluoride ($BF_3$), boron trichloride ($BCl_3$) and the like. The tungsten-containing precursors may include tungsten-containing gases such as, for example, $WF_6$, $WCl_6$ and $W(CO)_6$ and the like, while the reducing agents may include hydrogen gas ($H_2$), silane ($SiH_4$), disilane ($Si_2H_6$), hydrazine ($N_2H_4$) and germane ($GeH_4$). In a specific example, the bulk deposition process involves a chemical vapor deposition (CVD) reaction of tungsten-containing precursor, such as tungsten hexafluoride ($WF_6$), and reducing gases, such as hydrogen ($H_2$) to produce tungsten and a by-product, such as for example, hydrogen hexafluoride (HF) at temperature of about 250° C. to about 400° C.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating a conductive contact structure, the fabricating comprising:
   providing at least one contact opening disposed over a semiconductor substrate;
   forming a carbon-rich contact liner material comprising a carbon-containing species and an elemental carbon disposed therein, the carbon-containing species and the elemental carbon together defining a set carbon content within the carbon-rich contact liner material; and
   depositing the carbon-rich contact liner material conformally within the at least one contact opening disposed over the semiconductor substrate.

2. The method of claim 1, wherein the carbon-containing species comprises an oxide material, and wherein the oxide material further comprises at least one of a silicon-oxycarbide (SiOC) material or a silicon oxycarbonitride (SiOCN) material.

3. The method of claim 2, wherein forming comprises causing an interaction between a carbon source and an organosilane precursor in a plasma chamber to facilitate forming the silicon oxycarbide (SiOC) material and the elemental carbon therein, the silicon oxycarbide (SiOC) material and the elemental carbon being subsequently deposited conformally within the at least one contact opening.

4. The method of claim 3, wherein the carbon source comprises a carbon dioxide gas.

5. The method of claim 3, wherein the organosilane precursor comprises at least one of tetramethylsilane (4MS), trimethylsilane (3MS), dimethylsilane (2MS) or monomethylsilane (MS).

6. The method of claim 2, wherein forming comprises causing an interaction between a carbon source, an organosilane precursor and a nitrogen source in a plasma chamber to facilitate forming the silicon oxycarbonitride (SiOCN) and the elemental carbon therein, the silicon oxycarbonitride (SiOCN) and the elemental carbon being subsequently deposited conformally within the at least one contact opening.

7. The method of claim 6, wherein the carbon source comprises a carbon dioxide gas and a nitrogen source comprises at least one of a nitrous oxide gas or an ammonia gas.

8. The method of claim 6, wherein the organosilane precursor comprises at least one of tetramethylsilane (4MS), trimethylsilane (3MS), dimethylsilane (2MS) or monomethylsilane (MS).

9. The method of claim 1, wherein the carbon-rich contact liner material has a dielectric constant less than that of silicon nitride.

10. The method of claim 9, wherein the dielectric constant of the carbon-rich contact liner material has a range of about 2 to 6.

11. The method of claim 1, wherein the set carbon content disposed within the carbon-rich contact liner material has a range of about 5% to 50%, and wherein the set carbon content facilitates in tailoring the etch-property of the carbon-rich contact liner material disposed thereof.

12. The method of claim 11, wherein tailoring the etch-property of the carbon-rich contact liner material comprises making the carbon-rich contact liner material to be preferentially susceptible to anisotropic etching process, while inhibiting an isotropic etching process.

13. The method of claim 1, wherein the carbon-rich contact liner material is designed to function as an etch stop layer.

14. A device comprising:
   a conductive contact structure of a circuit structure, the conductive contact structure comprising:
      at least one contact opening disposed over a semiconductor substrate; and
      a carbon-rich contact liner material deposited conformally within the at least one contact opening, the carbon-rich contact liner material comprising a carbon-containing species and an elemental carbon disposed therein, wherein the carbon-containing species and the elemental carbon together define a set carbon content within the carbon-rich contact liner material.

15. The device of claim 14, wherein the carbon-containing species comprises an oxide material, and wherein the oxide material further comprises at least one of a silicon-oxycarbide (SiOC) material or a silicon oxycarbonitride material (SiOCN).

16. The device of claim 14, wherein the carbon-rich contact liner material has a dielectric constant less than that of silicon nitride.

17. The device of claim 16, wherein the dielectric constant of the carbon-rich contact liner material has a range of about 2 to 6.

18. The device of claim 14, wherein the carbon-rich contact liner material is designed to function as an etch stop layer.

19. The device of claim 14, wherein refractive index of the carbon-rich contact liner material has a range of about 1.4 to 2.0, and an extinction coefficient of the carbon-rich contact liner material has a range of about 0 to 0.45.

20. The device of claim 14, wherein the set carbon content disposed within the carbon-rich contact liner material has a range of about 5% to 50%, and wherein the set carbon contact facilitates in tailoring the etch-property of the carbon-rich contact liner material disposed thereof.

\* \* \* \* \*